United States Patent [19]

Iwata

[11] 4,082,984
[45] Apr. 4, 1978

[54] ELECTRIC FLASH DEVICE WITH PRINTED COIL TRANSFORMER

[75] Inventor: Hiroshi Iwata, Osaka, Japan

[73] Assignee: West Electric Company, Ltd., Osaka, Japan

[21] Appl. No.: 683,614

[22] Filed: May 5, 1976

[30] Foreign Application Priority Data

May 12, 1975 Japan .................................. 50-56591

[51] Int. Cl.² ............................................ H05B 41/32
[52] U.S. Cl. .............................. 315/241 P; 315/276; 315/278; 331/113 A; 354/145
[58] Field of Search ...................... 315/241 P, 276, 278; 354/145; 331/113 A

[56] References Cited

U.S. PATENT DOCUMENTS

| 2,474,988 | 7/1949 | Sargrove | 29/626 |
| 2,587,568 | 2/1952 | Eisler | 156/650 |
| 3,764,849 | 10/1973 | Ohta | 315/241 P |

*Primary Examiner*—Eugene R. LaRoche
*Attorney, Agent, or Firm*—Cushman, Darby & Cushman

[57] ABSTRACT

This invention relates to an improved small-sized electric flash device wherein transformers of its DC-DC converter circuit for producing a high voltage comprises printed coil or coils thereby efficiently reducing their volume and sufficiently flattering their shape, so that, together with miniaturized circuit parts and printed circuit substrate, highly integrated, hence compact photographic flash device is obtainable.

10 Claims, 16 Drawing Figures

ELECTRIC FLASH DEVICE WITH PRINTED COIL TRANSFORMER

BACKGROUND OF THE INVENTION

Hitherto, electric flash device have been used for photographing in dark places, for signaling or for commercial sign. Especially, they are much used as the photographing devices.

For such photographing flash lamps, in order to be used together with small size photographic camera it is preferable that the photographic flash lamp should be as small in size as possible.

A conventional photographic flash lamp of FIG. 8 comprises, as shown in a circuit diagram of FIG. 1 and in a perspective view with its case 100 removed of FIG. 9, two or four AA size batteries 5,5, a DC-DC converter part 1, a trigger circuit part 3 and a gas-discharge lamp part 4 including a gas-discharge lamp tube such as xenon-discharge tube 38. The DC-DC converter part 1 includes a converter transformer 8, and the trigger circuit part 3 includes a trigger transformer 18. As shown in FIG. 9, in the conventional photographic flash device, the height of a reflector 39 of the lamp and diameter of the capacitor 37 have had sizes which are larger than the diameter of the batteries 5,5. Accordingly, inside height of the case 100 has been decided to be a little greater than the diameter of the capacitor. Therefore, when these parts are installed in the case 100, there is formed a non-utilized space 41 under or above the batteries 5,5. Furthermore, in such conventional photographic flash device, the converter transformer 8, which has been shaped in ordinary roughly cubic type transformer, has generally been linearly arranged in the same line with the capacitor 37 and the lamp reflector 39, and therefore, these linearly located parts have took a considerable length, so that when the length has been longer than that of batteries 5,5, there have been formed another non-utilized space 42 facing the bottoms of the batteries 5,5. Existence of such two non-utilized spaces in the case of the conventional photographic device is an obstacle against miniaturization of the photographic flash device, even when the circuit part utilizes other miniaturized electronic parts such as transistors diodes, small sizes resistors, small size capacitors, small size neon lamp, small size switch, etc.

SUMMARY OF THE INVENTION

This invention purports to provide a compact-sized flash device by utilizing printed circuit coils (known for instance by U.S. Pat. Nos. 2,474,988 or 2,587,568) as a part or parts of the transformers, thereby drastically changing the shape of the transformers, hence enabling to utilize, as well as, eliminate the abovementioned non-utilized spaces.

BRIEF EXPLANATION OF THE DRAWING

FIG. 2 (A) to (E) are various views of a circuit part of a flash lamp according to the present invention, wherein:

FIG. 3(A) to (C) are various views of circuit part of another flash device according to the present invention, wherein:

FIG. 3(A) is the sectional elevation view,

FIG. 3(B) is the bottom view of a printed circuit substrate 24 showing its lower face with printed coils 9, 11 and 19, and FIG. 3(C) is a fragmental sectional elevation view.

FIG. 5(A) and (B) are views of another flash device according to the present invention, wherein:

FIG. 5(A) is a fragmental elevation view and

DETAILED DESCRIPTION OF THE INVENTION

The present invention is described in the following referring to several preferred examples.

Figure 1:
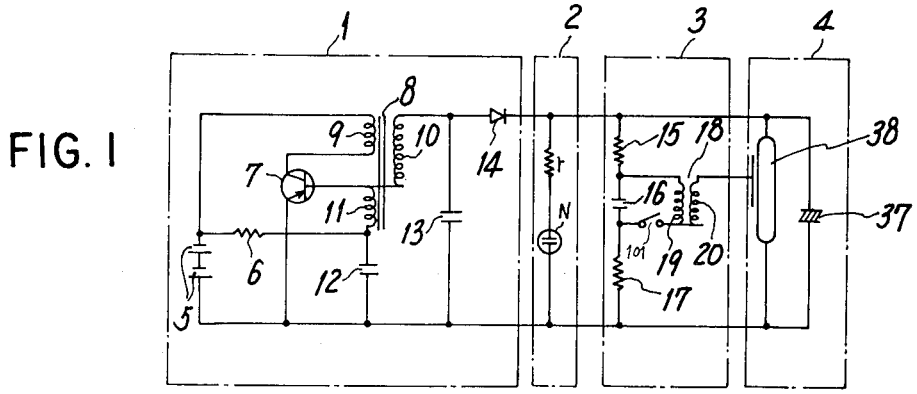
FIG. 1 is a circuit diagram showing a typical photographic flash device. The circuit is common both in the conventional lamp and in the device of the present invention.

FIG. 1 is a circuit diagram of a typical conventional photographic flash device, as well as of the photographic flash lamp of the present invention. The circuit of FIG. 1 consists of a DC-DC converter 1, a voltage indication part 2, a trigger circuit 3 and a lamp part 4. The DC-DC converter 1 comprises a DC source 5 such as two or four batteries, an oscillating transistor 7, a converter transformer 8 having a first coil 9, a second coil 11 and a third coil, i.e., an output coil 10, resistor 6, capacitors 12 & 13 and a rectifying diode 14. The voltage indication part 2 comprises a series resistor $r$ and a small neon lamp N. The trigger circuit 3 comprises trigger capacitor 16, a trigger switch 101, a trigger transformer 18 having a prinary coil 19 and a secondary coil 20 and resistors 15 and 17. The lamp part 4 comprises a xenon discharge lamp 38 and a capacitor 37 of large capacity connected across both discharging electrode of the discharge lamp 38.

In the circuit, the transistor 7 oscillates and produce a high AC voltage across both ends of the output coil 10. The high AC voltage is then rectified by the rectifier 14 and charges the capacitor 37. At the same time, the trigger capacitor 16 is also charged up. When the capacitor 37 is charged up to a preset level, the neon lamp N in the indication part 2 is lit. Thereafter, by switching the trigger switch 101 on, a high voltage pulse is given to the triggering electrode of the flash lamp 38, and triggers it to light by a discharging current taken out of the capacitor 37.

The mechanical structure of a first example of the present invention is shown in FIG. 2. As shown in FIG. 2, the flattened pot type magnetic core 21 comprises shallow box shape yoke part 211 and center leg 22 disposed in a space in the yoke part 211. A flatly shaped output coil 10 formed by winding a fine enamel coated insulated wire for many turns is disposed in the space in the yoke part 211 in a manner that the center leg 22 fit in a center hole 23 of the output coil 10. An insulator substrate 24 having printed first and second coils 9 and 11 on the lower face and printed wiring 241 and printed circuit elements on the upper face as shown in FIG. 2(D) is made by known printed circuit technology. The insulator substrate 24 is made of phenol resin plate or glass-fiber-reinforced epoxy resin plate etc. and wiring 241 and coils 9 & 11 are formed with copper film by known method, such as photoetching. The insulator substrate 24 has a hole 25 for allowing the center leg 22 of the magnetic core to fit therein. The circuit elements such as the resistor 6, capacitors 12, 13, transistor 7 and diode 14 are disposed on the upper face of the insulator substrate. The resistors are formed by, for instance, printing a paste containing tantalum oxide powder and organic binder. The capacitors are formed by for instance bonding ceramic capacitor chip on the substrate 24. The transistor 7 and the diode 14 are disposed by bonding semiconductor chips on the upper face of the substrate 24. Thus, circuit parts 26 other than the converter transformer 8 can be disposed on the upper face of the insulation substrate and the connection between the electric parts and the first and second coils 9 & 11 are made by known metal-plated through-hole connection method.

The output coil 10 of the converter transformer 8 must have so many turns as 1000 to 2000 turns in order to obtain a high voltage output across its both ends. Therefore, printed circuit technology is not suitable in forming the output coil 10. Accordingly, in the example the output coil 10 is formed by ordinary method of winding enamel-coated insulated wire of 0.02 to 0.1 mm diameter, and the output coil, which is formed to have similar area to that of the first and second coils 9 & 11 is disposed to face the latters. The output coil is shaped flat so as to be encapsulated in the pot type core 21 of shallow box shape. The core 21 is made of suitable magnetic material such as ferrite or molded magnetic powder.

Figure 2A:
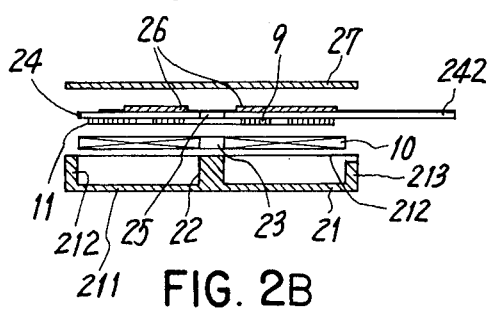
FIG. 2(A) is a fragmental sectional elevation view.
Figure 2C:
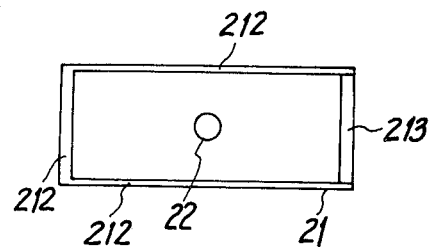
FIG. 2(C) is the plan-view of a flattened pot-type core 21.
Figure 2B:
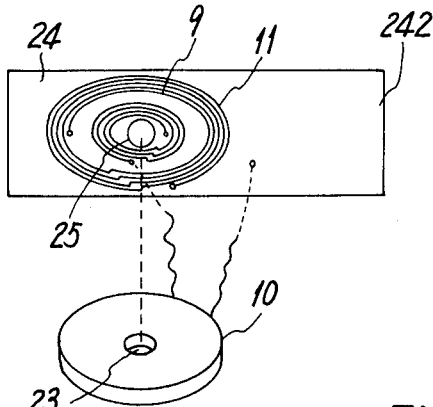
FIG. 2(B) is the bottom view of a printed circuit substrate 24 showing its lower face with printed coils 9 & 11 and a perspective view of an ordinary type output coil 10.
Figure 2D:
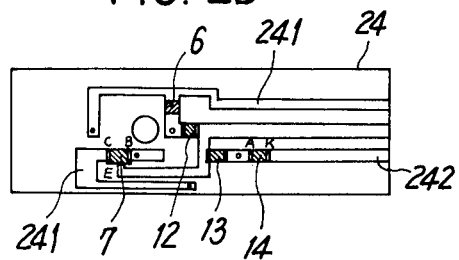
FIG. 2(D) is the plan-view of the upper side of the printed circuit substrate.
Figure 2E:
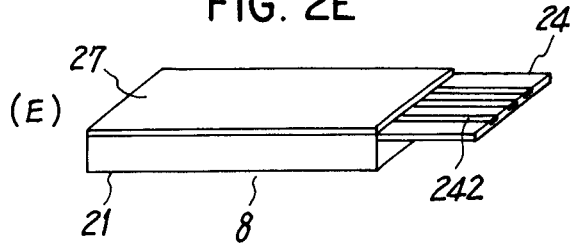
FIG. 2(E) is a perspective view of the assembled circuit part.

The abovementioned parts are assembled by disposing the output coil 10 in the space in box-shaped pot-type core 21 thereby inserting the protruding center leg 22 into the center hole 23 of the output coil 10, then disposing the printed circuit substrate 24 above the output coil 10 while inserting the protruding center leg 22 into the center hole 25 of the substrate 24, and then disposing a lid shaped upper yoke plate 27 of the pot-shaped core 21. The upper yoke plate 27 is made of suitable magnetic material such as ferrite or molded magnetic powder. The box shaped yoke 211, center leg 22 and lid shaped upper yoke plate 27 together form a box-shaped pot-type magnetic core. In the magnetic core 21, the top face of the center leg 22 contacts the lower face of the lid shaped upper yoke plate 27, the top faces of the three side walls 212, 212, 212 of the box-shaped yoke 211 contact the lower face of the corresponding three edges of the upper yoke plate 27. Above the side wall 213 which is made a little lower than other three side walls 212, 212, 212, there is formed a gap between the top face of the side wall 213 and the lower face of the corresponding part of the upper yoke 27, and the connecting end 242 of the printed circuit substrate is led out of the box-shaped core 21 through the above-mentioned gap. Thus, as shown in FIG. 2(E), the assembly is made to enclose the circuit part in the flattened converter transformer 8.

Figure 3A:
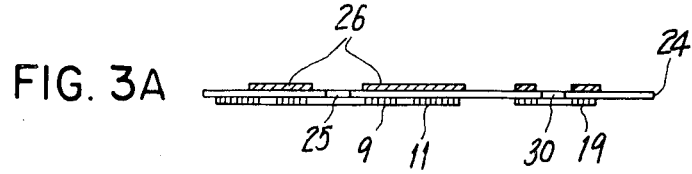
Figure 3B:
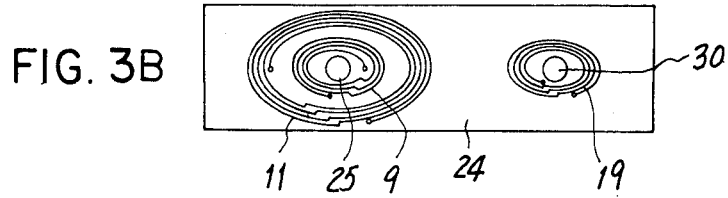
Figure 3C:
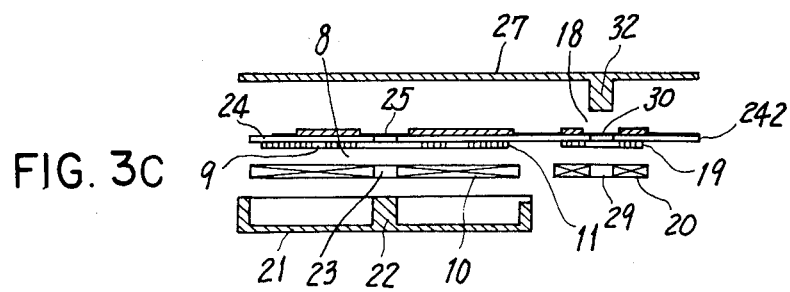

FIG. 3(A) to (C) show mechanical structure of a second example of the present invention. In this example, the trigger transformer 18 is also formed by utilizing the extended part of the printed circuit substrate 24 and the extended part of the upper yoke plate 27 of the converter transformer 8.

As shown in FIG. 3(A) to (C), in addition to the first and second coils of the converter transformer 8, a primary coil 19 of the trigger transformer 18 is also formed by the printed circuit technology on the lower face of the extended part of the insulation substrate 24, a hole 30 is formed in the insulation substrate 24 at the center part of the primary coil 19, a protrusion 32 of magnetic material is formed on the lower side of the upper yoke plate 27, and the secondary coil 20 of the trigger transformer 18 is formed by winding ordinary enamel-coated wire with a hole 29 at its center part.

Other parts are identical to the first example, and therefore, the aforementioned elucidation of the first example applies to the parts identical to the first example.

The abovementioned parts are assembled almost in the similar way with that of the first example, but difference from the first example is that, in this second example of FIG. 3, the protrusion 32 of the upper yoke plate 27 is inserted in the hole 30 of the insulation substrate 24 and in the hole 29 of the secondary coil 20, and the secondary coil 20 is fixed to the lower face of the insulation substrate 24 by, for instance, bonding with adhesive.

Thus, by the abovementioned assembling, the primary coil 19, the secondary coil 20 and the protrusion 32 form the trigger transformer 18.

Figure 4:
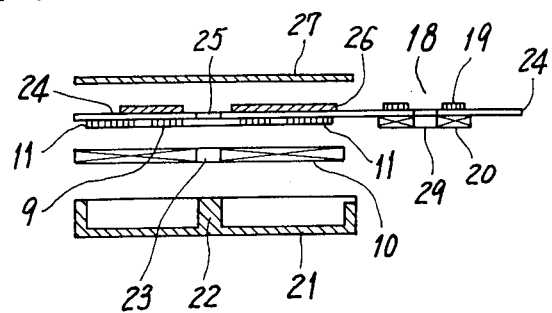
FIG. 4 is a fragmental sectional elevation view of another flash device according to the present invention.

FIG. 4 shows mechanical structure of a third example of the present invention. In this example, the trigger transformer 18 is formed dispencing with the magnetic core to be inserted in the center holes of the primary and secondary coils. Since the trigger transformer 18 serves to generate an attenuating oscillation of such high frequency as 0.5 to 2 mega Herz, and therefore, if a slight decrease of efficiency is acceptable, a magnetic core can be dispenced with. Therefore, in FIG. 4, the trigger transformer 18 is formed simply by disposing the printed primary coil 19 and the ordinary type wire-wound secondary coil 20 back to back on opposite faces of the same part of the insulation substrate 24.

Figure 5A:
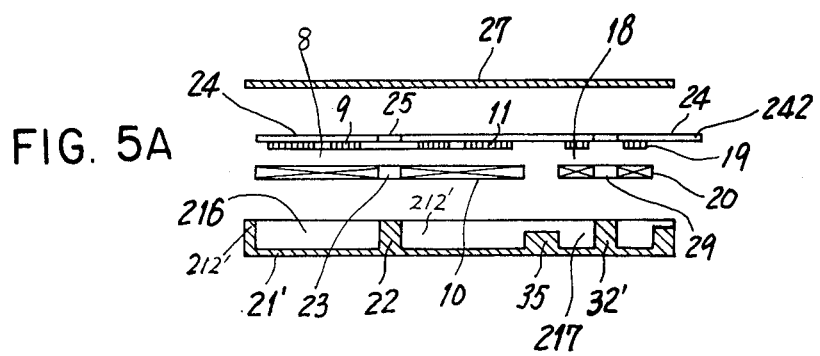

FIG. 5(A) and (B) show mechanical structure of a fourth example of the present invention. In the example, the converter transformer 8 and the trigger transformer 18 are formed in the same box-shaped flattened core.

As shown in FIG. 5(A) and (B), the shallow box-shaped pot-type core 21' has a larger and a smaller spaces 216 & 217 isolated from each other by a shielding wall 35, and protrusions 22 and 32' are formed in the spaces 216 and 217, respectively. The insulation substrate 24 has the first and the second coils 9 and 11 of the converter transformer 8 on the part corresponding to the larger space 216 and has the primary coil of the trigger transformer 18 on the part corresponding to the smaller space 217. The output coil 10 of the converter transformer 8 and the secondary coil 20 of the trigger transformer 18, both made by winding insulated fine wires, are disposed in the larger and the smaller spaces 216 and 217, respectively.

The abovementioned parts are assembled almost in the similar way with that of the first example of FIG. 2. Namely, the coils 10 and 20 are disposed in the spaces 216 and 217 of the box-shaped core 21, by inserting the protrusions 22 and 32' to the center holes 23 and 29 of the coils 10 and 20, respectively. Then, the insulation substrate 24 is disposed in the pot type core 21 in a manner that the protrusions 22 and 32' are inserted in the center holes 25 and 29 of the printed coils 9, 11 and 19, respectively. Finally, the upper yoke plate 27 extending across both spaces 216 and 217 is disposed like a lid on the box-shaped core 21', in a manner that the top faces of the protrusions 22 and 32' contact the lower face of the upper yoke plate 27 and the top faces of the three side wall parts 212' contact corresponding lower edge part of the upper yoke plate 27'.

Figure 6:
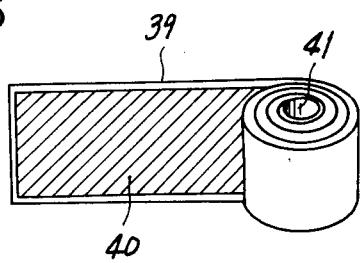
FIG. 6 is a perspective view of a material with which a coil is made.

In the abovementioned examples, the output coil 10 of the converter transformer 8 and the secondary coil 20 of the trigger transformer 18 are made by winding fine enamel-insulated wires, but the coils 10 and 20 can be made by other methods. One example of such other method is elucidated referring to FIG. 6. FIG. 6 shows a roll of a very thin polyester film belt 39 having a thin metal layer 40 formed on one face of the film. The metal layer 40 may be a film of copper, aluminum or gold formed by vacuum deposition or bonding on the polyester film belt 39. The roll has a hole 41 in central part. The roll is then sliced by parallel planes perpendicular to the axis of the roll in a manner that each sliced disc has a preset thickness. By using very thin film belt 39 of the insulator and very thin metal layer 40, a required number of turns of the coils are obtainable.

Figure 7:
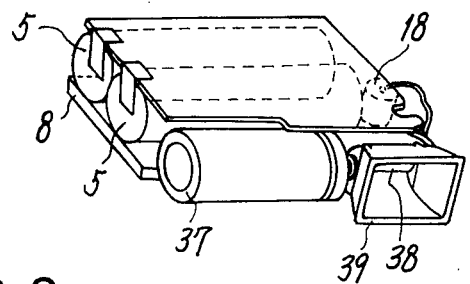
FIG. 7 is a perspective view of a flash device of the present invention, shown with its case removed.
Figure 8:
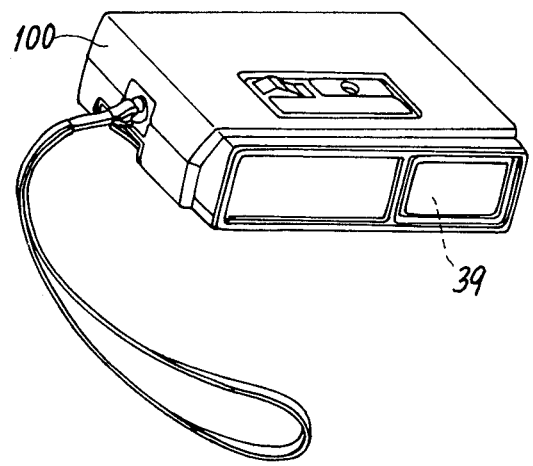
FIG. 8 is a perspective view of a conventional photographic flash device with its case installed.
Figure 9:
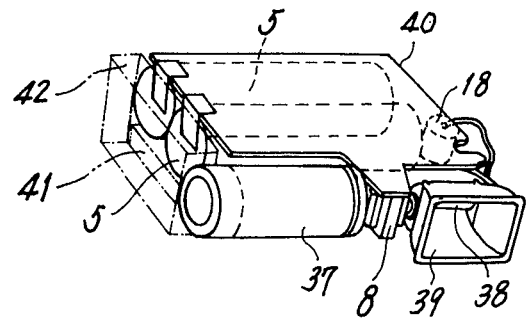
FIG. 9 is a perspective view of the conventional photographic flash device of FIG. 8, shown with its case removed.

FIG. 7 shows one example of an electric flash device of the present invention shown with its case removed. In FIG. 7, the converter transformer 8 is formed in a flat box shape, and is located in the hitherto non-utilized space under the batteries 5, 5. Thus, by means of such flattened converter transformer 8, the size of the flash device can be reduced by the width of the conventional converter transformer.

Figure 5B:
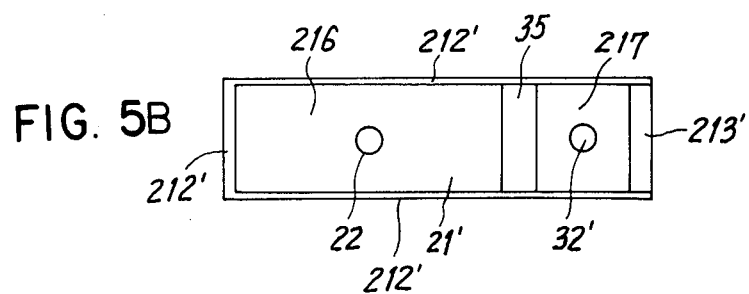
FIG. 5(B) is a plan-view of a flattened pot type core.

By utilizing the structure of the fourth example (i.e., FIG. 5), the space required for the trigger transformer 18 appearing in FIG. 7 can be eliminated, and therefore, the width of the flash lamp can be reduced further.

Though FIG. 1 shows a typical circuit of the electric flash lamp, the present invention is also applicable to other circuit configuration, for instance, that provided with constant charge regulation circuit or incident-light-responsive output regulation circuit, by further disposing such circuit on the insulation substrate and enclosing it in the flattened pot type core.

What I claim is:
1. An electric flash device comprising
    a battery,
    a transistorized DC-DC converter for converting D.C. output voltage of said battery to an output of an elevated D.C. voltage, which converter includes an oscillating transistor, at least one resistor, capacitors, a convertor transformer and a rectifying diode,
    a capacitor connected across the output terminals of said converter for accumulating said elevated voltage D.C. output of said DC-DC converter,
    a gas-discharge lamp connected across both ends of said capacitor so as to produce a flash of light when said charge accumulated in said capacitor is discharged upon receiving a trigger pulse and
    a trigger circuit comprising a trigger transformer for generating said trigger pulse to be impressed to said gas discharge lamp,
    wherein the improvement is that said converter transformer comprises at least one printed coil formed on an insulation substrate as a printed coil, at least one output coil formed by winding fine insulated wire and a magnetic core inserted in both center holes of said printed coil and said output coil, said printed coil and said output coil being disposed electromagnetically to couple to each other.

2. An electric flash device according to claim 1, wherein said oscillating transistor, said resistor, said capacitors and said rectifying diode are disposed on said insulation substrate.

3. An electric flash device according to claim 1 wherein said printed coil and said output coil are encapsulated in a shallow box-shaped pot-type magnetic core.

4. An electric flash device according to claim 1, wherein a primary coil of said trigger transformer is another printed coil formed on an extended part of said insulation substrate.

5. An electric flash device according to claim 1 wherein said output coil of said converter transformer is a sliced roll of an insulation film with a metal film on it.

6. An electric flash device according to claim 4, wherein both of said converter transformer and said trigger transformer are formed in a first and a second space in the same shallow box-shaped pot-type magnetic core.

7. An electric flash device according to claim 4 wherein resistors capacitors and electric wiring among them are made on said insulation substrate.

8. An electric flash device according to claim 4 wherein said secondary coil of the trigger transformer is a sliced roll of an insulation film with a metal film on it.

9. An electric flash device according to claim 3, wherein said pot-type magnetic core including said printed coil and said output coil therein is disposed in a space formed between inside wall of an outer case and the enclosed assembly of said battery, gas-discharge lamp, capacitors, and other electric circuit parts.

10. An electric flash device according to claim 6 wherein said pot-type magnetic core including said converter transformer and said trigger transformer is disposed in a space formed between inside wall of an outer case and the enclosed assembly of said battery, gas-discharge lamp, capacitors, and other electric circuit parts.

* * * * *